United States Patent
Kuroda

[19]

[11] Patent Number: 6,008,655
[45] Date of Patent: Dec. 28, 1999

[54] FREQUENCY DIVIDER TESTING CIRCUIT CLOCK-SAMPLING WINDOW VARIABLE WITH DIVIDER OUTPUT

[75] Inventor: Hidehiko Kuroda, Tokyo, Japan

[73] Assignee: NEC Corporation, Tokyo, Japan

[21] Appl. No.: 08/915,115

[22] Filed: Aug. 20, 1997

[30] Foreign Application Priority Data

Aug. 20, 1996 [JP] Japan .................................. 8-218782

[51] Int. Cl.⁶ .................................................. G01R 23/02
[52] U.S. Cl. .......................... 324/537; 327/47; 324/76.72
[58] Field of Search ............................. 324/537, 73.47, 324/73.46, 158.1, 76.72; 327/17, 18, 21, 48, 47, 23, 27; 377/28, 29

[56] References Cited

U.S. PATENT DOCUMENTS

| | | | |
|---|---|---|---|
| 3,304,504 | 2/1967 | Horlander | 324/76.47 X |
| 3,895,293 | 7/1975 | Munz | 324/76.74 |
| 3,971,994 | 7/1976 | Shepherd | 324/76.47 X |
| 3,990,007 | 11/1976 | Hohhaf | 324/76.72 |
| 4,168,467 | 9/1979 | Bailey et al. | 324/76.82 |

FOREIGN PATENT DOCUMENTS 60-169222  9/1985  Japan .
7-218603  8/1995  Japan .

*Primary Examiner*—Josie Ballato
*Assistant Examiner*—T. R. Sundaram
*Attorney, Agent, or Firm*—Sughrue, Mion, Zinn, Macpeak & Seas, PLLC

[57] ABSTRACT

For testing a frequency divider, oscillations are produced and wave-shaped into a series of dock pulses. The dock pulses are supplied to a frequency divider under test. A window pulse of duration equal to one cycle of the output pulses of the frequency divider is used to sample the clock pulses. The sampled clock pulses are counted and compared with a reference value. Depending on the number of the sampled clock pulses relative to the reference value, an output voltage at one of two discrete values is produced to indicate the result of the test.

5 Claims, 2 Drawing Sheets

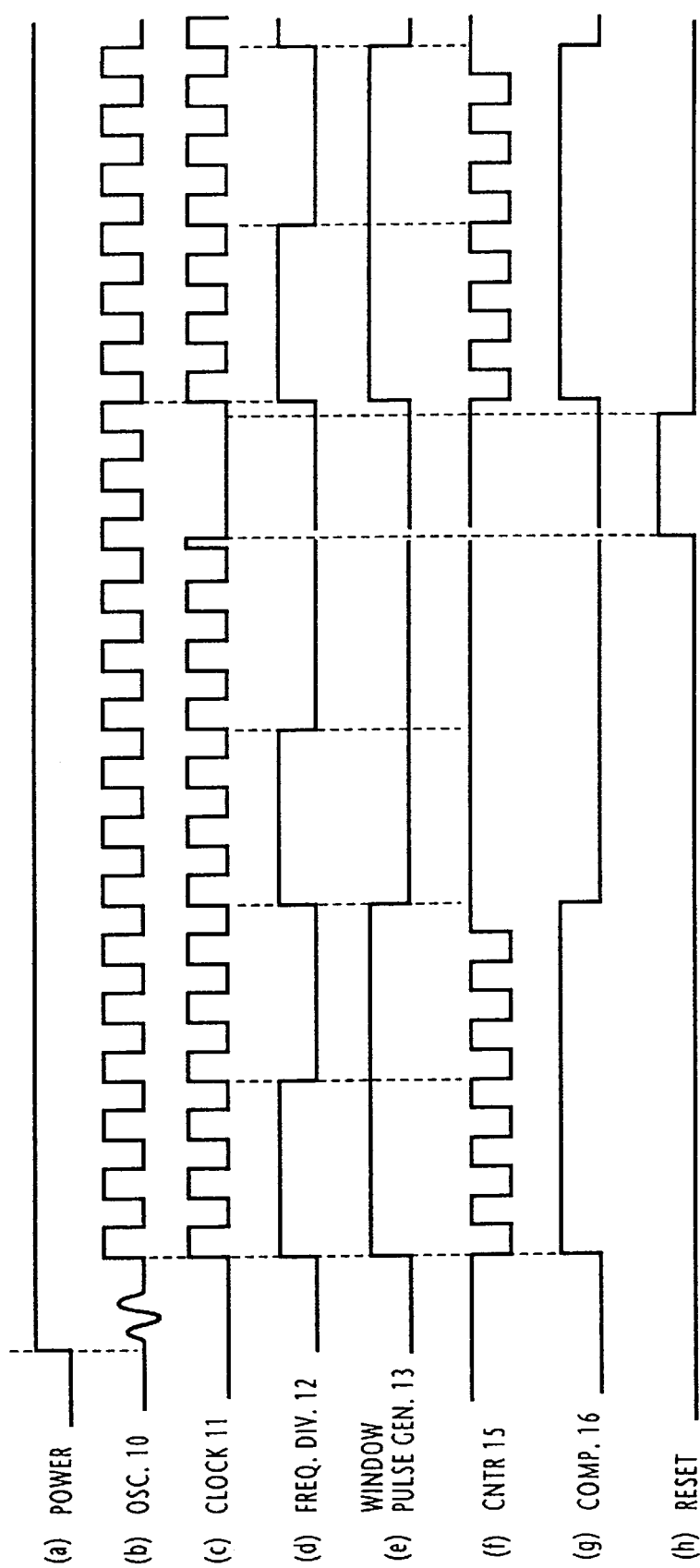

FREQUENCY DIVIDER TESTING CIRCUIT CLOCK-SAMPLING WINDOW VARIABLE WITH DIVIDER OUTPUT

BACKGROUND OF THE INVENTION

1. Field of the Invention

The present invention relates to a circuit for testing frequency dividers.

2. Description of the Related Art

In a prior art frequency divider tester, as illustrated in FIG. 1, the frequency of an oscillator 1 is divided by a reference single-ratio frequency divider 2. The output of frequency divider 2 feeds a frame generator 4 to supply a NAND gate 5 with a frame pulse which defines a predetermined period of time, called reference frame. A single-ratio frequency divider 3 is the circuit that is under test. This frequency divider, having the same frequency dividing ratio as that of the reference frequency divider, is connected between the oscillator and the NAND gate. The output pulses of the under-test frequency divider, which are produced during a reference frame, are detected by the NAND gate and their binary count value is determined by a binary counter 6 and compared in a digital comparator 7 with a reference binary value manually established by an array of switches 8. The result of the test is obtained by checking the output of the comparator. When the frequency divider under test is functioning properly, the comparator inputs are of equal value and a high-level output is produced by the comparator. Otherwise, the comparator output is low.

However, one disadvantage of the prior art is that, if the frequency divider under test has more than one frequency dividing ratio, it is necessary to provide as many reference single-ratio frequency dividers as there are frequency dividing ratios. Another disadvantage is that since the oscillator is directly connected to both frequency dividers, instability results when it is energized during start-up. In addition, if there is a timing difference between both frequency dividers, the edges of the waveforms produced by the frequency divider under test and the frame generator do not coincide with each other. As a result, the output waveform of the NAND gate is not precise, causing a false output from the binary counter.

SUMMARY OF THE INVENTION

It is therefore an object of the present invention to provide a circuit for testing frequency dividers without using a reference frequency divider.

Another object of the present invention is to provide a frequency divider testing circuit which is robust and accurate.

In order to obtain the stated objects, a testing circuit of the present invention comprises an oscillator for producing oscillations, a pulse forming circuit having a decision threshold for forming said oscillations into a series of clock pulses when said decision threshold is exceeded by said oscillations and supplying the clock pulses to a frequency divider under test, and a window pulse generator for producing a window pulse of duration equal to one cycle of output pulses from the frequency divider. The dock pulses are sampled by a gate circuit in response to the window pulse and the number of sampled clock pulses is counted and compared with a reference count.

Since the duration of the window pulse varies with the operating performance of the frequency divider as well as with the dividing ratio of the frequency divider, the number of clock pulses sampled during a window pulse for a given dividing ratio is a measure of the operating performance of the frequency divider of the same ratio currently being tested. Because the number of such pulses for a particular dividing ratio is known in advance, a number of predetermined values are used as reference counts for a number of dividing ratios. Therefore, the present invention eliminates the need for a reference frequency divider and the testing circuit can be used for all frequency dividers regardless of their ratios. In addition, since the initial instability of the oscillator during start-up is absorbed by the pulse former, false measurement can be avoided.

BRIEF DESCRIPTION OF THE DRAWINGS

The present invention will be described in further detail with reference to the accompanying drawings, in which:

FIG. 3 is a timing diagram associated with FIG. 2;

DETAILED DESCRIPTION

Figure 1:
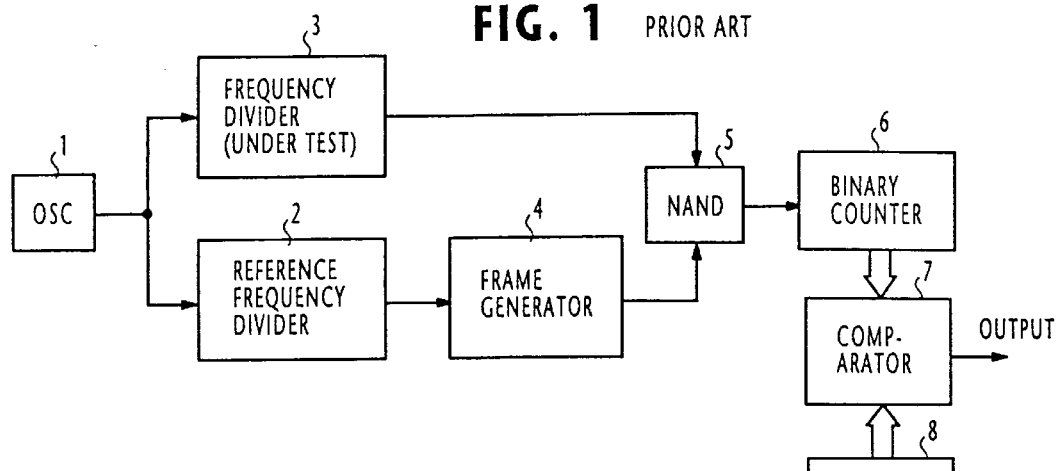
FIG. 1 is a block diagram of a prior art frequency divider testing circuit.
Figure 2:
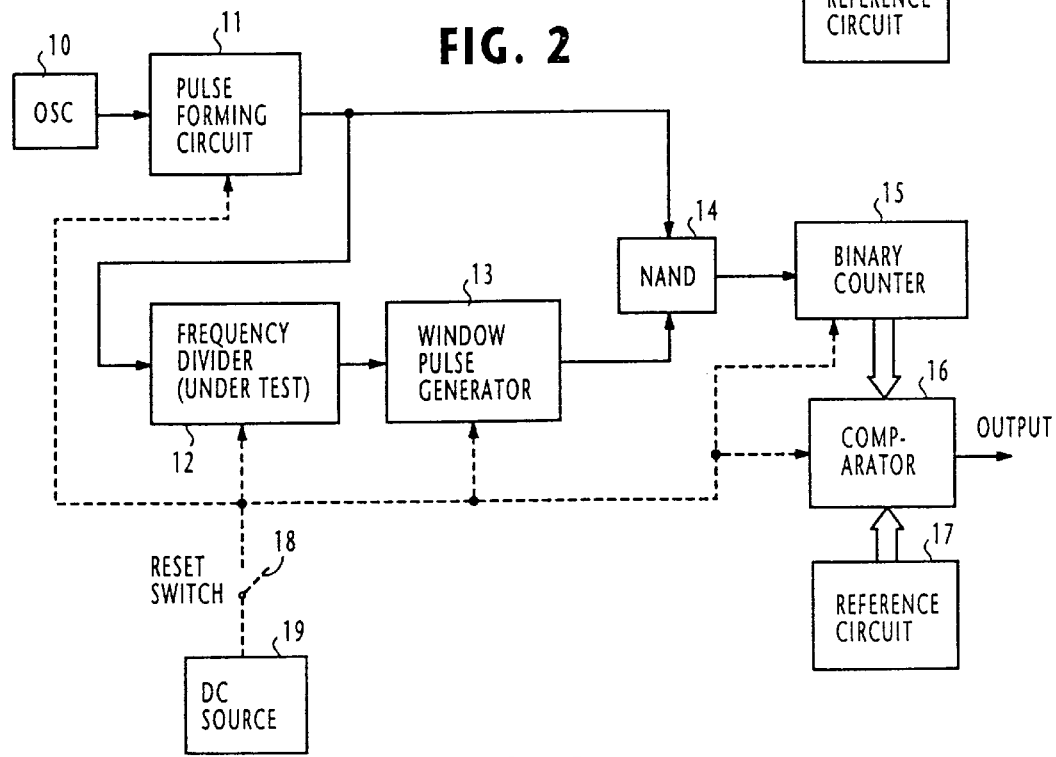
FIG. 2 is a block diagram of a frequency divider testing circuit according to one embodiment of the present invention.

Referring to FIG. 2, a frequency divider testing circuit according to one embodiment of this invention comprises an oscillator 10 and a pulse-former 11. Pulse former 11 has a predefined decision threshold for determining whether the input voltage has a significant amplitude. If the decision threshold is exceeded, the pulse former produces a high level output and when the input lowers below the threshold the pulse former produces a low level output. Thus, the output of oscillator 10 is wave-shaped and square-wave clock pulses are produced by the pulse former 11.

When the testing circuit is initially energized as shown in part (a) of FIG. 3, the oscillator 10 is energized and starts producing output pulses (part (b) of FIG. 3). When the oscillator 10 is not stabilized during the initial warm-up (delay) period, the pulse former 11 produces low level output. When the oscillator 10 is stabilized, producing square-wave pulses, the pulse former 11 produces sharply defined versions of these pulses as shown in part (c) of FIG. 3.

A frequency divider 12, which is under test, is connected to the output of pulse former 11 to count down the clock pulses and produces its output as shown in part (d) of FIG. 3. The frequency divider 12 is either a single-ratio or a multi-ratio frequency divider. A window pulse generator 13 is connected to th frequency divider 12 to respond to the leading edges of its successive output pulses for producing a window pulse equal in duration to one cycle of the frequency divider, as illustrated in part (e) of FIG. 3.

The outputs of the window pulse generator 13 and the pulse former 11 are coupled to a NAND gate 14. In response to a window pulse, the NAND gate 14 allows clock pulses from pulse former 11 to pass therethrough to a binary counter 15, where the pulses are counted (part (f) of FIG. 3).

The binary number of the clock pulses detected by &he counter 15 is compared in a comparator 16 with a binary reference value from reference circuit 17. When the frequency divider 12 is functioning properly, the output of binary counter 15 equals the reference value and the comparator 15 produces a high-level output, as shown in part (g) of FIG. 3. Otherwise, the comparator output is low. The output of the comparator 16 is analyzed by an external evaluation circuit, not shown, to produce the result of the test.

A switch 18 is provided in a reset circuit which connects a DC reset voltage from a voltage source 19 to pulse former 11, window pulse generator 13, counter 15 and comparator 16. When the switch 18 is momentarily dosed, a high-level reset pulse is produced (part (h) of FIG. 3) and pulse former 11, window pulse generator 13, counter 15 and comparator 16, are brought into a quiescent state and their internal states are initialized. At the trailing edge of the reset pulse, the pulse former 11 starts producing clock pulses, causing the output of frequency divider 12 to go high simultaneously with the leading edge of its first clock pulse. As a 27 result, the output of window pulse generator 13 goes high and then goes low simultaneously with successive leading edges of the frequency divider output.

Since the duration of a window pulse varies depending on the operating performance of a frequency divider under test as well as on its dividing ratio, while the clock frequency is constant, the number of clock pulses sampled by a window pulse for a given dividing ratio is a measure of the operating performance of a frequency divider of the same ratio currently being tested. Because the number of such pulses for a particular dividing ratio is known in advance, a plurality of predetermined values are set as reference counts in the reference circuit 17 for a number of frequency dividing ratios. Therefore, the testing circuit of the present invention can be used for all frequency dividers regardless of their frequent dividing ratios.

In addition, since the initial instability of the oscillator 10 during start-up is absorbed by the pulse former 11, false measurement can be avoided.

Figure 4:
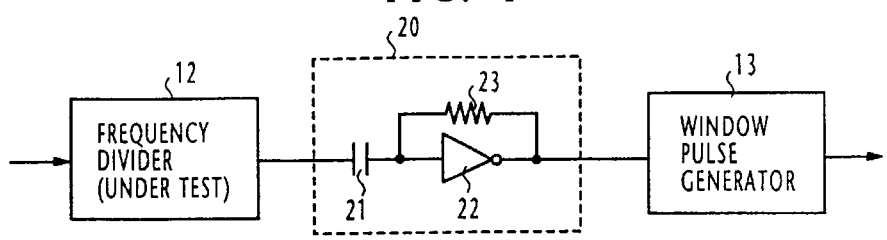
FIG. 4 is a block diagram of a portion of a frequency divider testing circuit according to a modified embodiment of the present invention.

In a modified embodiment shown in FIG. 4, an interface circuit 20 is provided between the frequency divider 12 and the window pulse generator 13. This interface circuit is formed by a capacitor 21, a CMOS (complementary metal oxide semiconductor) inverter 22 connected in series with the capacitor 21 to the output of frequency divider 12, and a resistor 23 connected in shunt with the inverter 22. The provision of this interface is to connect the output of frequency divider to the window pulse generator, regardless of the logic level of the frequency divider, such as ECL (emitter-coupled logic) and TTL (transistor-transistor-logic).

What is claimed is:
1. A circuit for testing frequency dividers, comprising:
an oscillator for producing oscillations;
a pulse forming circuit having a decision threshold for forming the oscillations into a series of dock pulses when the decision threshold is exceeded by the oscillations and supplying the clock pulses to a frequency divider under test;
a window pulse generator for producing a window pulse of duration equal to one cycle of output pulses from the frequency divider;
a gate circuit for sampling the dock pulses in response to the window pulse;
a counter connected to the gate circuit for producing a count number indicating the number of clock pulses present during the window pulse; and
a comparator for producing an output voltage at one of two discrete values depending on the count number relative to a reference value.

2. The circuit of claim 1, further comprising a reset circuit for initialing the pulse forming circuit, the window pulse generator, the counter and the comparator.

3. The circuit of claim 1, further comprising an interface circuit between the frequency divider under test and the window pulse generator.

4. The circuit of claim 3, wherein the interface circuit comprises a CMOS (complementary metal oxide semiconductor) implemented circuit.

5. A method for testing a frequency divider, comprising:
producing oscillations;
wave-shaping the oscillations into a series of clock pulses when a decision threshold is exceeded by the oscillations and supplying the clock pulses to a frequency divider under test;
producing a window pulse of duration equal to one cycle of output pulses from the frequency divider;
sampling the clock pulses in response to the window pulse;
producing a count number indicating the number of clock pulses present during the window pulse; and
comparing the count number with a reference value and producing an output voltage at one of two discrete values depending on the count number relative to said reference value.

* * * * *